United States Patent
Evers et al.

(10) Patent No.: US 10,634,210 B2
(45) Date of Patent: *Apr. 28, 2020

(54) ISOLATOR FOR A STATIONARY VIBRATION ISOLATION SYSTEM

(71) Applicant: Integrated Dynamics Engineering GmbH, Raunheim (DE)

(72) Inventors: Arndt Evers, Oestrich-Winkel (DE); Till Scharf, Heusenstamm (DE)

(73) Assignee: Integrated Dynamics Engineering GmbH, Raunheim (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/619,088

(22) Filed: Jun. 9, 2017

(65) Prior Publication Data

US 2017/0370441 A1 Dec. 28, 2017

(30) Foreign Application Priority Data

Jun. 23, 2016 (EP) ..................................... 16175910

(51) Int. Cl.
*F16F 15/023* (2006.01)
*F16F 15/027* (2006.01)
*G03F 7/20* (2006.01)

(52) U.S. Cl.
CPC ........ *F16F 15/027* (2013.01); *F16F 15/0275* (2013.01); *F16F 15/0232* (2013.01); *G03F 7/709* (2013.01)

(58) Field of Classification Search
CPC .. F16F 15/027; F16F 15/0232; F16F 15/0275; F16F 15/022; F16F 15/023; F16F 15/046; G05D 19/00; G05D 19/02

USPC ....................................................... 267/140.14
See application file for complete search history.

(56) References Cited

U.S. PATENT DOCUMENTS

| | | | | |
|---|---|---|---|---|
| 3,889,936 A | * | 6/1975 | Shimizu ................ | F16F 15/027 105/198.1 |
| 5,090,299 A | | 2/1992 | Santi et al. | |
| 5,111,735 A | * | 5/1992 | Johnson ............... | B60G 17/052 91/433 |
| 5,121,898 A | * | 6/1992 | Yasuda .................. | G05D 19/02 248/550 |
| 5,267,725 A | * | 12/1993 | Wode .................... | F16F 9/0454 267/122 |
| 6,322,060 B1 | * | 11/2001 | Mayama ................ | F16F 15/02 188/378 |

(Continued)

FOREIGN PATENT DOCUMENTS

| | | |
|---|---|---|
| DE | 4241997 C1 | 5/1994 |
| DE | 4324595 C1 | 12/1994 |

(Continued)

OTHER PUBLICATIONS

"Search Report" issued in counterpart EP patent application No. 16175910.5, dated Feb. 2, 2017.

(Continued)

*Primary Examiner* — Bradley T King
*Assistant Examiner* — Stephen M Bowes
(74) *Attorney, Agent, or Firm* — Kaplan Breyer Schwarz, LLP (57) ABSTRACT

An isolator for a stationary vibration isolation system, which is effective in the horizontal and vertical directions, the isolator comprising at least one pneumatic actuator.

5 Claims, 11 Drawing Sheets

(56) References Cited

U.S. PATENT DOCUMENTS

| | | | |
|---|---|---|---|
| 6,746,005 B1* | 6/2004 | Su | F16F 7/1011 |
| | | | 248/638 |
| 7,095,482 B2 | 8/2006 | Phillips et al. | |
| 7,125,008 B2 | 10/2006 | Hayashi et al. | |
| 7,320,414 B2 | 1/2008 | Davis | |
| 7,552,620 B2 | 6/2009 | Deroos et al. | |
| 8,387,958 B2 | 3/2013 | Heiland | |
| 8,556,047 B2* | 10/2013 | Kondou | F16F 9/065 |
| | | | 188/283 |
| 8,567,303 B2* | 10/2013 | Ingersoll | F04B 43/0054 |
| | | | 92/98 D |
| 9,618,076 B2* | 4/2017 | Kropp | F16F 15/027 |
| 2006/0042059 A1* | 3/2006 | Satoh | F04B 37/14 |
| | | | 29/25.01 |
| 2007/0246871 A1* | 10/2007 | Hayashi | F16F 9/0409 |
| | | | 267/140.12 |
| 2009/0283942 A1* | 11/2009 | Nakamura | B60G 17/0155 |
| | | | 267/64.13 |
| 2010/0001445 A1* | 1/2010 | Maruyama | F16F 15/0275 |
| | | | 267/113 |
| 2015/0260255 A1* | 9/2015 | Tan | F16F 15/0232 |
| | | | 248/550 |
| 2016/0084339 A1* | 3/2016 | Evers | F16F 15/0232 |
| | | | 267/140.3 |
| 2017/0175845 A1 | 6/2017 | Evers et al. | |
| 2017/0370442 A1* | 12/2017 | Evers | F16F 15/0275 |

FOREIGN PATENT DOCUMENTS

| | | | |
|---|---|---|---|
| EP | 2759736 A1 | 7/2014 | |
| EP | 2998611 A1 | 3/2016 | |
| FR | 2993943 A1 | 1/2014 | |
| JP | 11294520 A * | 10/1999 | F16F 15/02 |
| JP | 2000220690 A | 8/2000 | |
| SU | 612087 A1 | 6/1978 | |
| WO | 2008038433 A1 | 4/2008 | |

OTHER PUBLICATIONS

Non Final Office Action dated May 29, 2018 in U.S. Appl. No. 15/619,211, filed May 29, 2018.
List of references Mailed on May 29, 2018 for U.S. Appl. No. 15/619,211.
"Search Report" issued in related co-pending EP Application No. 16175909.7, dated Jan. 10, 2017.
Integrated Dynamics Engineering GmbH, Related co-pending unpublished U.S. Appl. No. 15/619,211, filed Jun. 9, 2017.
Final Office Action issued in U.S. Appl. No. 15/619,211, dated Nov. 8, 2018, 6 pp.
Communication from the Examining Division received for EP Patent Application No. 16175910.5, dated Aug. 27, 2018, 2 pages.
Notice of Allowance and Fees Due (PTOL-85) received for U.S. Appl. No. 15/619,211, dated Jan. 28, 2019, 6 pages.

* cited by examiner

ISOLATOR FOR A STATIONARY VIBRATION ISOLATION SYSTEM

European Patent Application No. 16 175 910.5, filed on Jun. 23, 2016, is incorporated herein by reference.

FIELD OF THE INVENTION

The invention relates to an isolator for a stationary vibration isolation system. More particularly, the invention relates to an isolator implemented as a pneumatic spring and including an actuator for active vibration isolation.

The invention in particular relates to stationary, i.e. immovably installed vibration isolation systems which are employed to support in vibration isolated manner lithography and/or metrology systems for the processing of semiconductor devices.

The invention furthermore relates to a pneumatic actuator for a stationary vibration isolation system.

BACKGROUND OF THE INVENTION

Stationary vibration isolation systems such as employed in particular for supporting lithography or metrology devices for the processing of semiconductors usually consist of a table which is mounted on a plurality of isolators.

Known from practice are in particular active vibration isolation systems which comprise an active control system counteracting seismic vibrations or vibrations caused by the load (machines) to be isolated. For example, sensors arranged on the floor and/or on the load to be isolated may be used to measure vibrations. The acquired measurement values are used by a control device to actively generate compensation signals which are used to drive actuators for active vibration isolation. In practice, mostly magnetic actuators which are arranged in or on a pneumatic or mechanical (e.g. coil spring) isolator are used to produce counterforces.

With the size of the semiconductor devices to be processed, the size of the systems employed for this purpose also increases. Therefore, the reaction forces that need to be exerted by the actuators are higher and higher, which makes the use of electrically driven actuators more difficult. As a result, a plurality of actuators operating according to the magnetic principle have to be connected in parallel in one direction of action. This is complicated or even impossible in some applications due to the limited installation space available. The use of magnetic actuators is moreover limited by the always existing heat dissipation therefrom.

The need to drive magnetic actuators may certainly be reduced by incorporating a pneumatic level control of the vibration isolation system into the active vibration isolation. However, this is not always sufficient to eliminate the aforementioned drawbacks.

A mechanical vibration isolator comprising a coil spring is disclosed in published patent application EP 2 759 736 A2 (Integrated Dynamics Engineering GmbH).

Published patent application EP 2 998 611 A2 (Integrated Dynamics Engineering GmbH) discloses an isolator comprising an air spring with a characteristic that can be adapted through a replaceable leaf spring assembly and which comprises a bending pendulum to provide an isolating effect in horizontal direction.

OBJECT OF THE INVENTION

Given this background, the invention is based on the object of mitigating the drawbacks of the prior art.

In particular it is intended to provide a universally employable isolator for an active vibration isolation system, which enables to achieve high compensation forces and, at the same time, low heat dissipation.

SUMMARY OF THE INVENTION

The object of the invention is already achieved by an isolator for a stationary vibration isolation system and by a pneumatic actuator according to the illustrative embodiment disclosed herein.

The invention relates to an isolator for a stationary vibration isolation system. More particularly, the invention relates to an isolator for a vibration isolation system on which machines for processing semiconductor devices are mounted in vibration isolated manner, in particular lithography or metrology equipment.

Such a vibration isolation system typically comprises a plate which is arranged on at least three isolators with vibration isolation with respect to the floor.

The isolator is effective in horizontal and vertical direction, that means decoupling with respect to the floor is provided in the horizontal direction and also in the vertical direction.

For this purpose, the isolator preferably comprises a spring. More particularly the isolator comprises a spring which is effective at least in the vertical direction.

The spring may in particular be configured as a pneumatic spring.

In one embodiment of the invention, the pneumatic spring is effective only in the vertical direction, whereas a further component, in particular a bending pendulum, is provided for decoupling in the horizontal direction.

According to the invention the isolator comprises at least one pneumatic actuator.

Thus, the isolator is intended for use in an active vibration isolation system which allows to generate compensation forces, by means of a pneumatic actuator, for actively reducing vibrations.

In this case, the actuator is preferably not used for decoupling from the floor the load which is supported with vibration isolation, but only to generate compensation forces in order to produce counterforces.

In contrast to the prior art described above, the actuator for generating compensation forces is implemented as a pneumatic actuator. It has been found that it is possible to produce high counterforces even with a pneumatic actuator. At the same time, heat dissipation is significantly reduced compared to electrically operated actuators.

In one embodiment of the invention, the pneumatic actuator extends annularly around a piston of the pneumatic spring.

The working space of the pneumatic actuator, that is to say the pressure volume through which forces are generated by the piston of the pneumatic actuator, preferably also extends annularly around a piston of the isolator which is part of a pneumatic spring that serves to decouple from the floor the load supported with vibration isolation.

The pneumatic actuator is thus an integral part of the isolator. This allows for a particularly compact design.

The pneumatic actuator may in particular be arranged within a working space of the pneumatic spring.

In a preferred embodiment, a piston of the pneumatic actuator is guided by at least two leaf springs that are spaced apart from each other.

It is in particular contemplated that a gap is provided between the piston of the pneumatic actuator and the adjacent wall of the working space, which gap has a sufficient width so that the piston will not engage the adjacent wall of the working space during normal operating conditions.

In this manner, any frictional forces which might cause vibrations are prevented from arising between the piston and the adjacent wall.

Preferably, a piston of a pneumatic spring of the isolator is also guided axially by the at least two leaf springs that are spaced apart from each other.

According to this embodiment it is therefore contemplated that both the pneumatic actuator and the pneumatic spring are effective in only one spatial direction, preferably only in the vertical direction. For axially guiding the piston of the isolator and of the pneumatic actuator, leaf springs spaced apart from each other are provided, through which the pistons are each coupled to the base of the isolator, that is the bottom part of the isolator, in such a manner that the two pistons can only be displaced in axial direction.

In a further embodiment of the invention, the pneumatic actuator is effective in two spatial directions. For this purpose it is in particular contemplated that the piston divides the working space of the actuator into two pressure chambers.

Thus, the piston can be displaced in two opposite directions by introducing fluid into the respective pressure chamber.

In a further embodiment of the invention, the isolator comprises both, an actuator that is effective in the horizontal direction, and an actuator that is effective in the vertical direction.

Both actuators are preferably implemented as pneumatic actuators. Thus, compensation forces can be generated both in the vertical and horizontal directions.

The pneumatic actuator which is effective in the vertical direction preferably has an effective axis which substantially coincides with the effective axis of the spring, in particular of the pneumatic spring. In this manner, no rotational forces are introduced into the system during the generation of compensation forces in the vertical direction.

The invention further relates to a pneumatic actuator for a stationary vibration isolation system. The pneumatic actuator is in particular intended for use in an isolator as described above.

According to the invention, the pneumatic actuator comprises an annular working space in which a piston is arranged.

The pneumatic actuator has an annular configuration, which makes it possible, on the one hand, to extend a component of the isolator through the actuator, for example a component of a spring.

On the other hand, this makes it possible in a simple manner to have an effective axis of the pneumatic actuator collocated with an effective axis of a spring of the isolator.

The pneumatic actuator comprises a piston which is preferably spaced apart from the wall of the working space by a gap.

According to one embodiment of the invention, the working space is divided into two pressure chambers. Thus, two working chambers are provided as defined by the pressure chambers, which makes it possible in a simple manner to design the pneumatic actuator so as to be effective in two opposite directions.

The working space or the two pressure chambers are preferably closed by at least one membrane.

Thus, the working space is not sealed by the piston running in the working space, but by a flexible membrane. This allows for a particularly low stiffness in the effective direction, since there is no frictional contact between any components. At the same time, the generation of vibrations caused by components sliding on and relative to each other is avoided.

The invention furthermore relates to an active vibration isolation system which comprises at least one isolator as described above and/or at least one pneumatic actuator as described above.

An active vibration isolation system usually comprises sensors which detect vibrations of the floor and/or vibrations of the load supported with vibration isolation. These sensors are connected to a control device which controls actuators in order to generate compensation forces.

Such compensation forces can counteract vibrations of the floor prolongating into the system and can also reduce vibrations generated by parts of the load that is supported with vibration isolation, such as, for example, machines with moving parts.

For controlling the one or more pneumatic actuator(s), pneumatic valves are provided which are driven by the control device.

Since due to the compressibility of a pneumatic fluid the volume of the fluid introduced into the pneumatic actuator is not proportional to the generated force, it is contemplated according to one embodiment of the invention that a pressure sensor is integrated into a control loop for controlling the pneumatic actuator, which sensor measures the pressure within a working space of the pneumatic actuator, in particular within a pressure chamber. With such a pressure sensor, proportionality can be achieved in a simple manner.

Alternatively, it is conceivable to use a force sensor which directly measures the force exerted by the pneumatic actuator.

BRIEF DESCRIPTION OF THE DRAWINGS

The subject matter of the invention will now be described in more detail with reference to an exemplary embodiment illustrated in the drawings of FIGS. 1 to 12.

DETAILED DESCRIPTION

Figure 1:
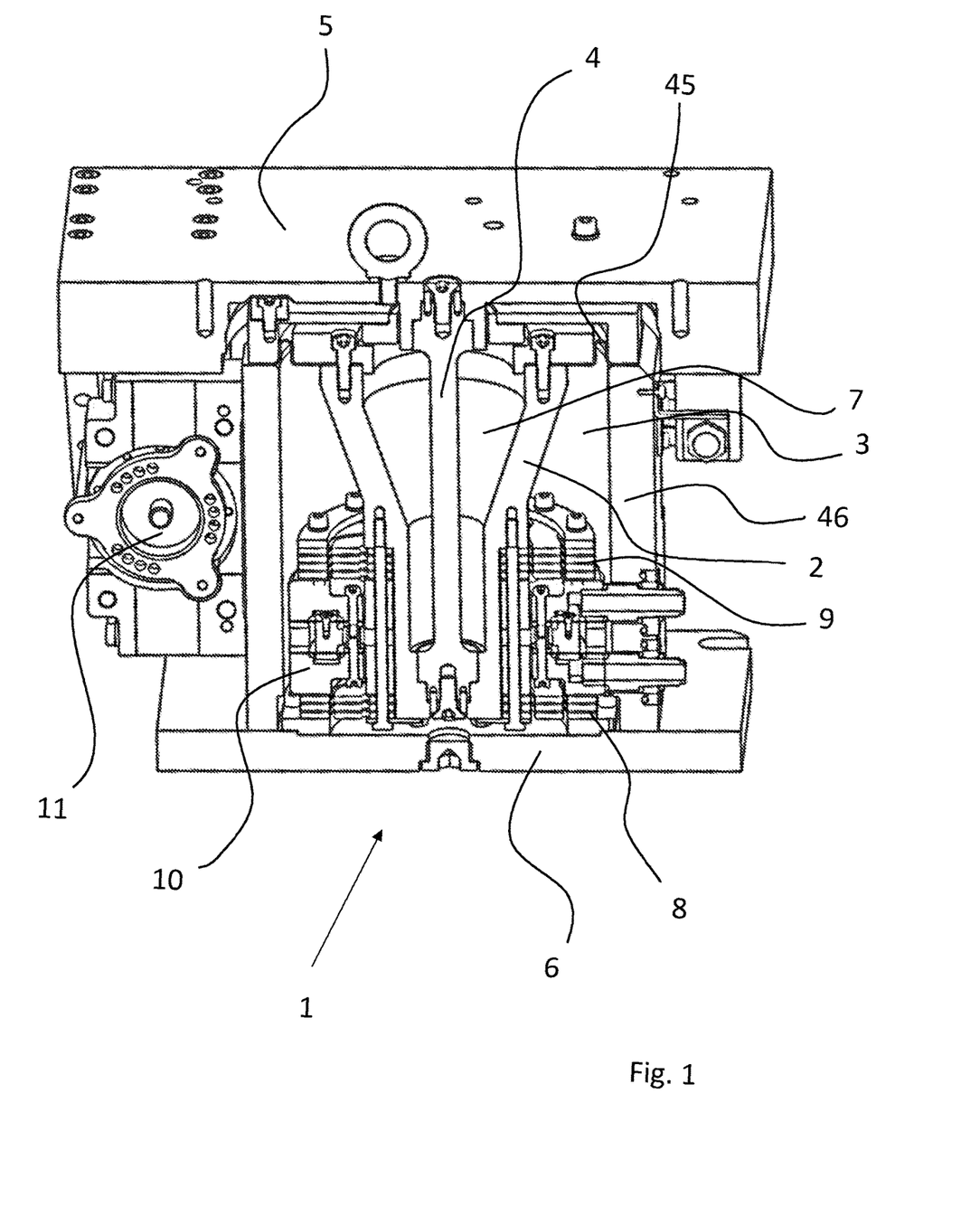
FIG. 1 is a cutaway view of an exemplary embodiment of an isolator according to the invention.

FIG. 1 is a cutaway perspective view of one embodiment of an isolator 1 according to the invention.

The isolator 1 comprises an upper part 5 which is provided in the form of a plate in this exemplary embodiment and which is part of the load to be isolated in the installed state.

The upper part 5 is mounted in vibration-isolated manner with respect to the base 6 which is connected to the floor in the installed state.

In the present exemplary embodiment, the isolator 1 comprises a pneumatic spring for this purpose.

The working space 3 of the pneumatic spring can be seen, into which compressed air can be introduced.

The piston 2 is supported through the working chamber 3, thus providing vibration isolation in the vertical direction.

Working chamber 3 is closed by a membrane 45.

Piston 2 is guided axially by two leaf spring assemblies 8, 9 that are spaced apart from each other.

In order to provide a horizontal isolation effect, the piston 2 is connected to the upper part 5 through a bending pendulum 4.

In order to provide a compact configuration, the bending pendulum 4 is located in a recess 7 of piston 2 in this embodiment.

Furthermore, the isolator 1 comprises the pneumatic actuator 10 which is effective in the vertical direction and is able to generate compensation forces.

The pneumatic actuator 10 has an annular configuration and is located within the working space 3 of the pneumatic spring.

Furthermore, the pneumatic actuator 10 is located between the two leaf spring assemblies 8 and 9.

For generating compensation forces in the horizontal direction, at least one further pneumatic actuator 11 is provided, which is located next to the housing 46 of working space 3 of the pneumatic spring.

Figure 2:
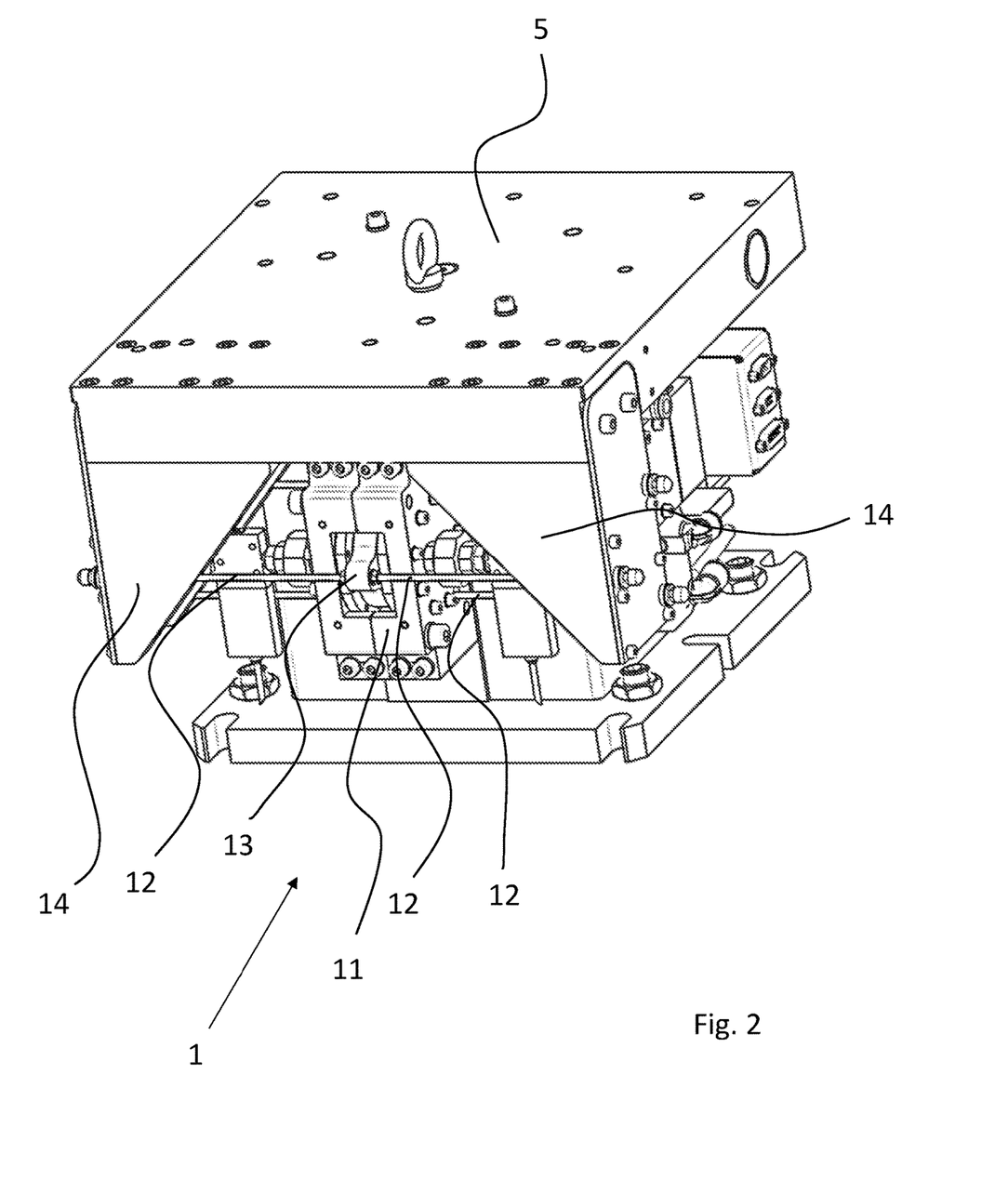
FIG. 2 is a perspective view of the isolator.

FIG. 2 is a perspective view of the isolator illustrated in FIG. 1.

Here, in particular the pneumatic actuator 11 can be seen, which is used to generate counterforces in the horizontal direction.

As can be seen, an extension 13 protrudes out of the pneumatic actuator 11. Extension 13 is connected to a piston or part of a piston by means of which counterforces are generated.

The piston is connected to brackets 14 of the upper part 5 through bending rods 12.

Bending rods 12 serve to decouple the actuator 11 transversely to the direction of action thereof.

Extension 13 which is visible here protrudes laterally out of the housing of pneumatic actuator 11. Further extensions are arranged within the housing, and in this case the bending rods extend through openings of the housing of pneumatic actuator 11.

Figure 3:
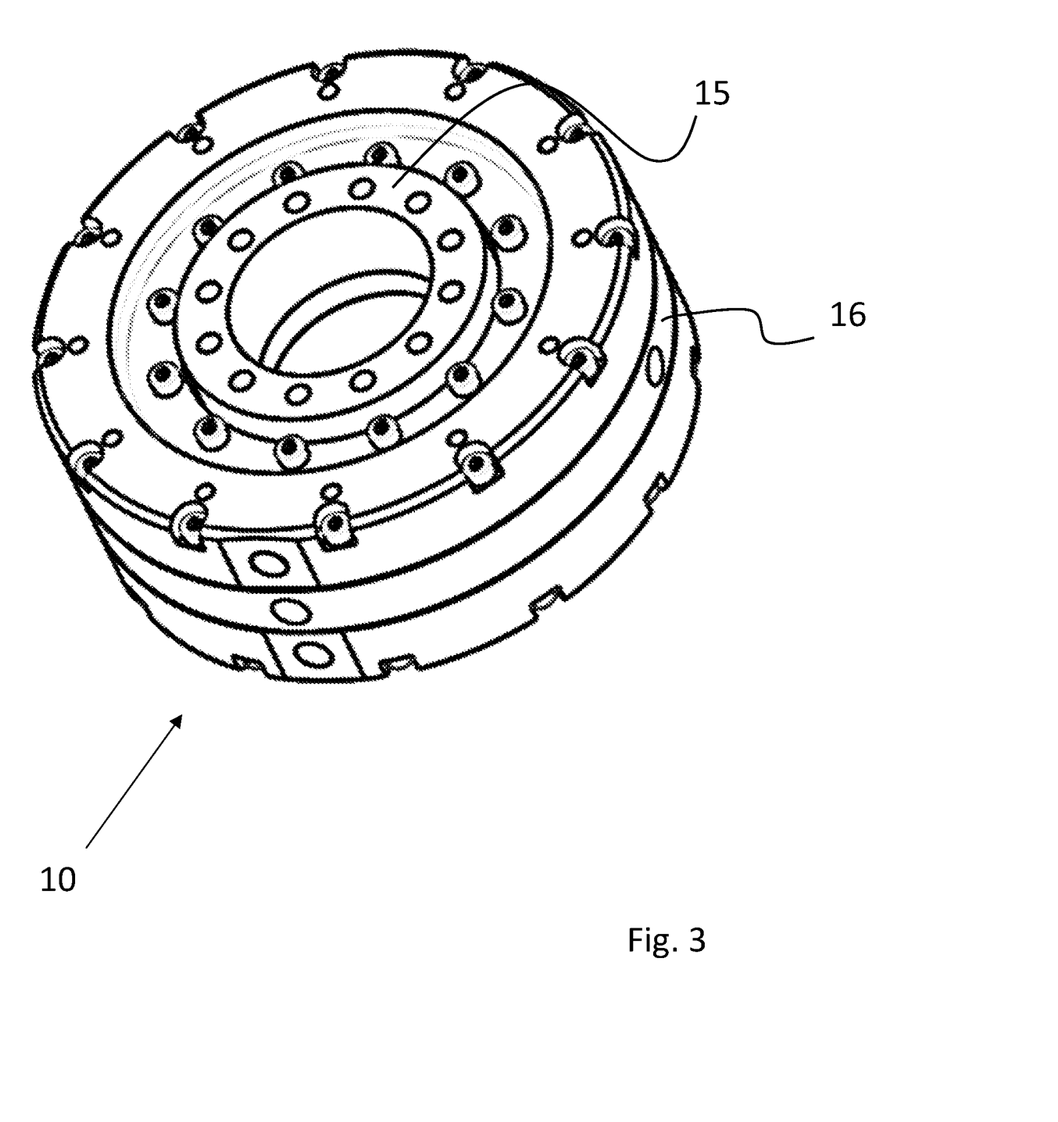
FIG. 3 is a perspective view of a pneumatic actuator used for the isolator.

FIG. 3 is a perspective view of the pneumatic actuator 10 illustrated in FIG. 1.

Pneumatic actuator 10 has an annular configuration and consists of a housing 16 in which a piston 15 is arranged which is movable in axial direction.

Figure 4:
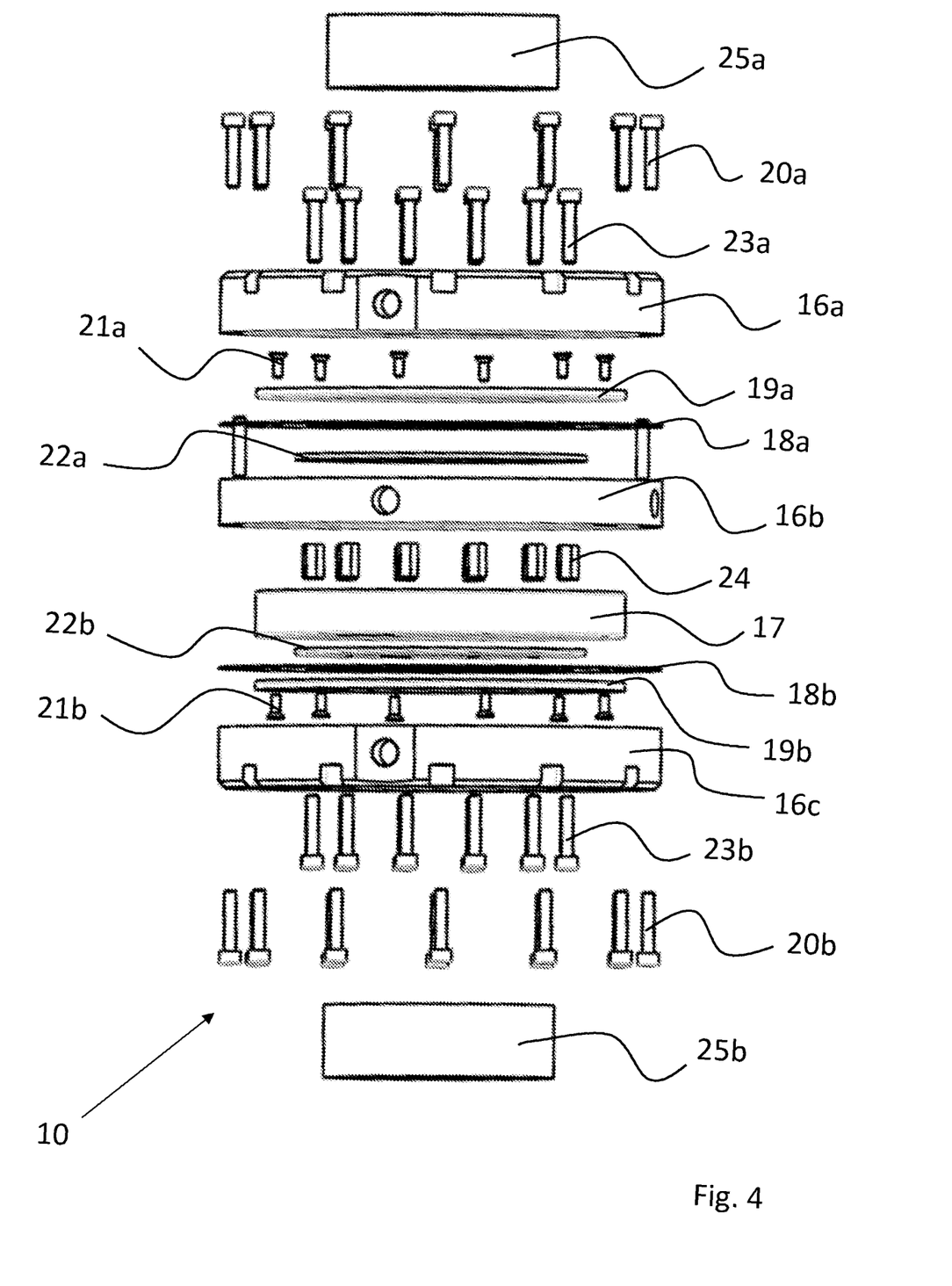
FIG. 4 is an exploded view of the actuator illustrated in FIG. 3.

FIG. 4 is an exploded view of the pneumatic actuator illustrated in FIG. 3.

As can be seen, the housing consists of three parts, namely the housing upper part 16a, the housing middle part 16b, and the housing lower part 16c.

Within the so defined housing, a piston is arranged, which in this exemplary embodiment consists of a piston middle part 17 to which the extensions 25a and 25b are secured.

Extensions 25a and 25b can be connected to the load to be isolated, while the housing (consisting of parts 16a to 16c) is coupled to the base.

The pneumatic actuator 10 illustrated here is effective in two opposite directions.

For this purpose, the piston, or the piston middle part 17, divides the working space into two pressure chambers.

The pressure chambers are each sealed by a membrane 18a, 18b, so that in this exemplary embodiment one pressure chamber is provided between the housing upper part 16a and membrane 18a, and the other pressure chamber is provided between the housing lower part 16c and membrane 18b.

Membranes 18a, 18b are connected to the piston, or piston middle part 17.

For this purpose, a respective clamping ring 19a, 19b is intended.

Thus, clamping rings 19a and 19b are each located in the pressure chamber.

Clamping rings 19a and 19b are secured to the piston or piston middle part 17 by means of screws 21a and 21b thereby fixing a respective membrane 18a, 18b. A clamping ring 22a, 22b which is arranged opposite to clamping rings 19a and 19b fixes the respective membrane 18a, 18b to the housing or housing upper part 16a and housing lower part 16c, respectively.

In this exemplary embodiment, housing upper part 16a and housing lower part 16c are connected to housing middle part 16b by means of screws 20a and 20b.

Furthermore, another annular array of screws 23a, 23b is provided. Screws 23a and 23b are screwed into threaded sleeves 24 thereby connecting the housing upper part 16a and the housing lower part 16c.

Threaded sleeves 24 extend through bores of the piston or piston middle part 17, which bores are sufficiently large so that the threaded sleeves 24 have enough clearance in the piston to not abut against the bores of the piston.

The additional connection produced through screws 23a and 23b and threaded sleeves 24 serves for optimum surface contact pressure of the housing components. It will be understood that this could as well be dispensed with.

Membranes 18a and 18b serve to seal the housing upper part 16a and at the same time the housing lower part 16c from the housing middle part 16b.

It will be understood that the pneumatic actuator 10 furthermore has fluid feeds for supplying compressed air to the working spaces.

Figure 5:
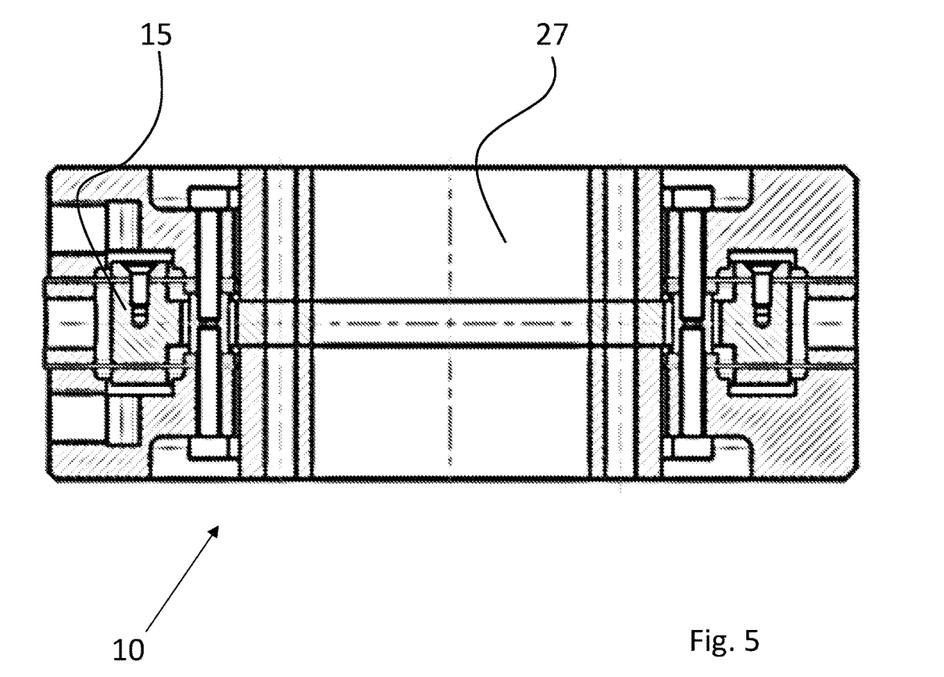
FIG. 5 is a sectional view of the actuator.

FIG. 5 is a sectional view of the pneumatic actuator 10 illustrated before.

The annularly shaped piston 15 can be seen.

Furthermore, it can be seen that the pneumatic actuator 10 has a central passage 27 through which components of the isolator may extend, for example.

Figure 6:
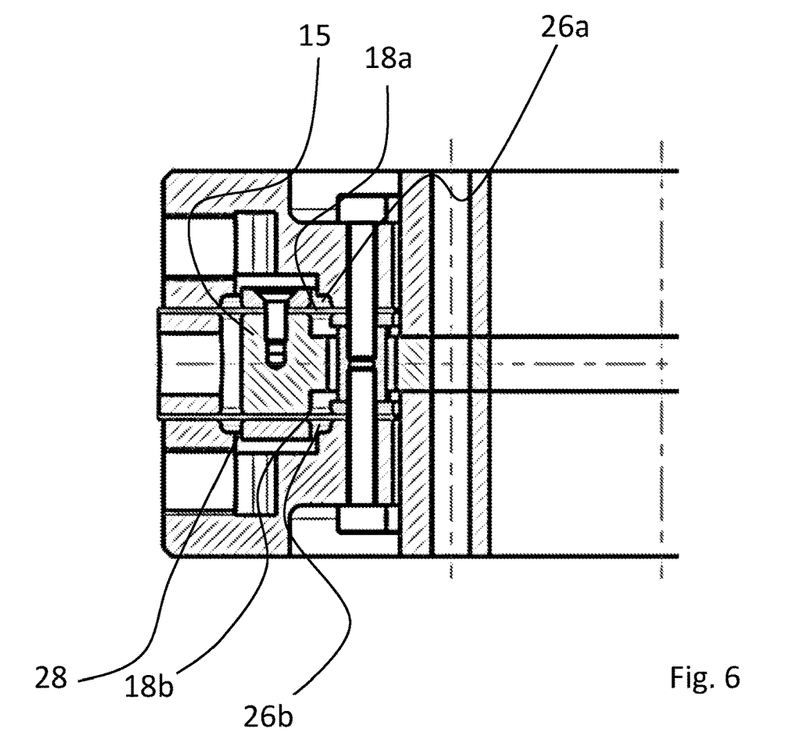
FIG. 6 illustrates a detail of FIG. 5.

FIG. 6 is a detailed view of FIG. 5.

It can be seen that piston 15 is spaced apart from the adjacent housing wall by a gap 28.

Pressure chambers 26a and 26b are sealed a membrane 18a, 18b.

Furthermore, it can be seen that the working space defined by pressure chambers 26a, 26b is quite small. For the pneumatic actuator, a very small working space is sufficient, in particular a working space of less than 10 cm$^3$, preferably less than 5 cm$^3$, since the actuator is not used as a pneumatic spring, but only serves for producing counterforces.

In case a pneumatic spring is used as an isolating element, the volume of the working space of the pneumatic actuator (total of the volumes of the pressure chambers) is preferably at most ⅕, more preferably at most ¹⁄₁₀, of the volume of the working space of the pneumatic spring.

Figure 7:
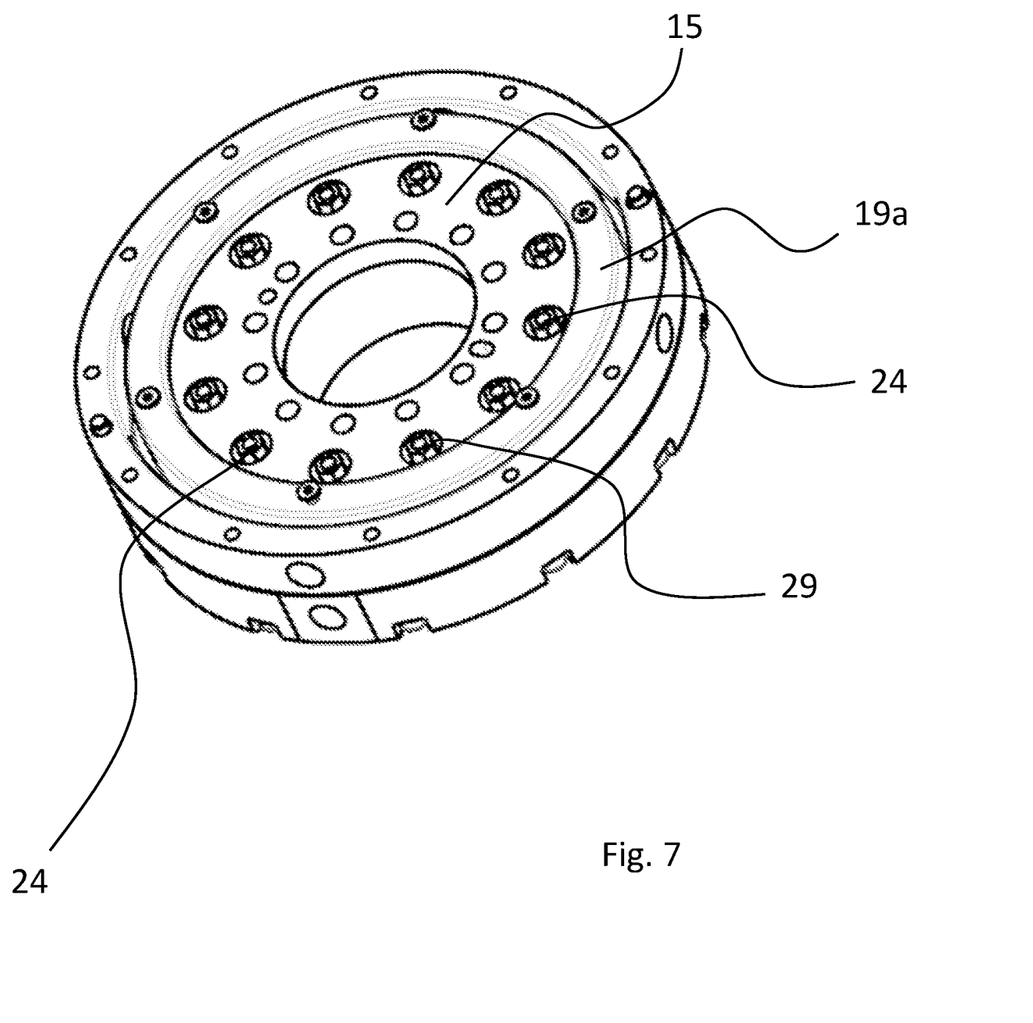
FIG. 7 is a perspective view of the actuator, where one part of the housing and a membrane sealing the working chamber have been omitted.

FIG. 7 is a perspective view of the pneumatic actuator, in which the housing upper part and the membrane sealing the upper working chamber have been omitted.

In this view, the clamping ring 19a can be seen which is used to secure the membrane (omitted) to the piston 15.

Furthermore, threaded sleeves 24 are visible which are used to connect the housing upper part and housing lower part and which are arranged with clearance in bores 29 of the piston 15.

Figure 8:
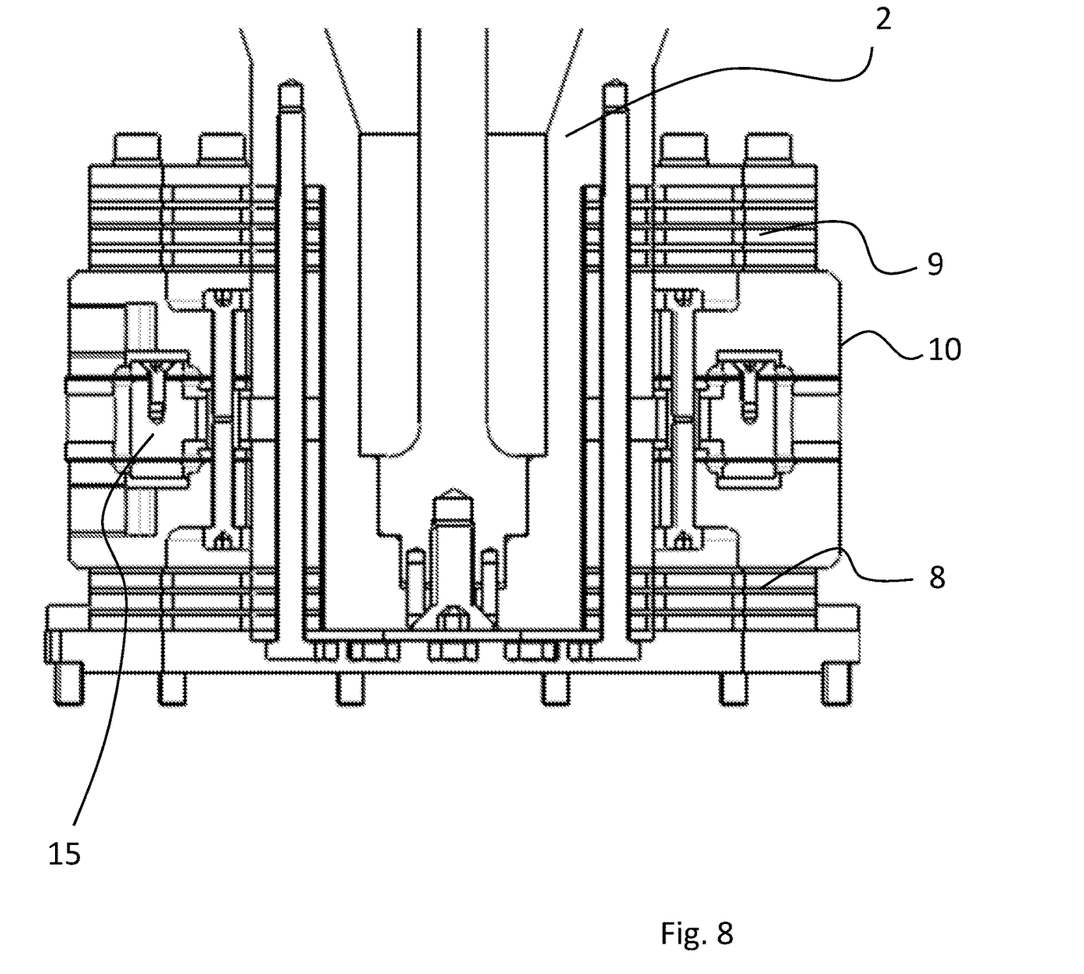
FIG. 8 is a sectional view of a detail, in which the actuator can be seen installed in the isolator.

FIG. 8 is another sectional view of the isolator.

The annular piston 15 of pneumatic actuator 10 can be seen extending around the piston 2 of the pneumatic spring of the isolator.

Piston 15 is connected to piston 2.

The effective axis of the pneumatic spring comprising piston 2 and the effective axis of the pneumatic actuator 10 thus coincide.

Moreover, leaf spring assemblies 8 and 9 can be seen, which are spaced apart from each other and between which the pneumatic actuator 10 is arranged.

Since piston 15 is rigidly connected to piston 2, both the piston 2 and the piston 15 of the pneumatic actuator is guided axially by the spaced apart leaf springs of leaf spring assemblies 8 and 9.

Figure 9:
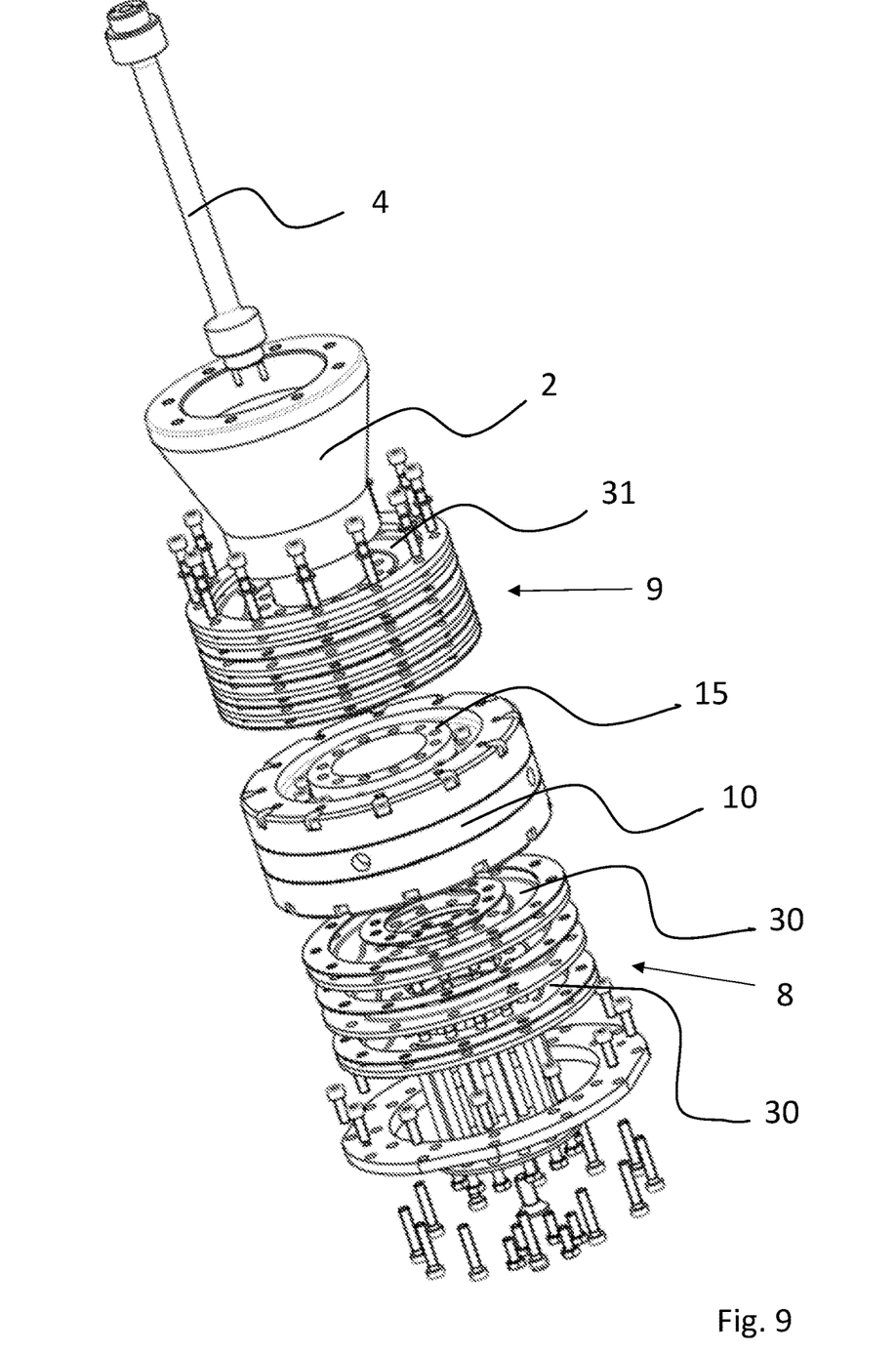
FIG. 9 is an exploded view of the components located in the working space of the isolator.

FIG. 9 is an exploded perspective view of the components which are arranged in the working space of the pneumatic spring in the installed state.

The bending rod 4 can be seen, which is connected to piston 2.

Furthermore, it can be seen that both the leaf springs 31 of the upper leaf spring assembly 9 and the leaf springs 30 of the lower leaf spring assembly 8 consist of annular segments.

Pneumatic actuator 10 can simply be mounted between the leaf spring assemblies 8 and 9.

Piston 15 is connected to piston 2 as well as to leaf spring assemblies 8 and 9.

Figure 10:
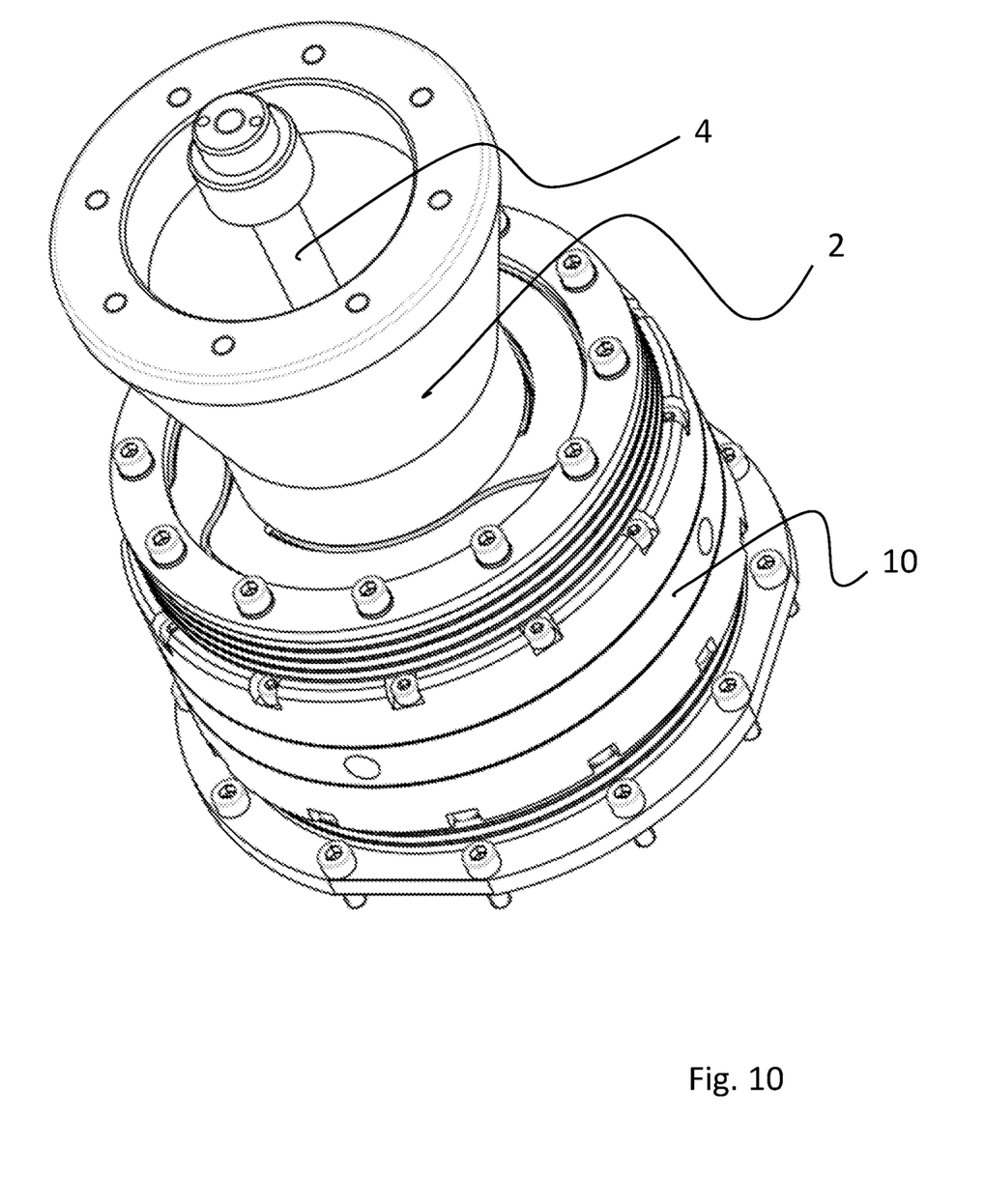
FIG. 10 is a perspective view of the components arranged in the working space of the isolator.

FIG. 10 shows the components illustrated in FIG. 9 in the assembled state.

As can be seen, the pneumatic actuator 10 is an integral part of an inner portion of the pneumatic spring comprising the piston 2, from which the bending pendulum 4 is protruding which will be coupled to the load to be isolated.

Figure 11:
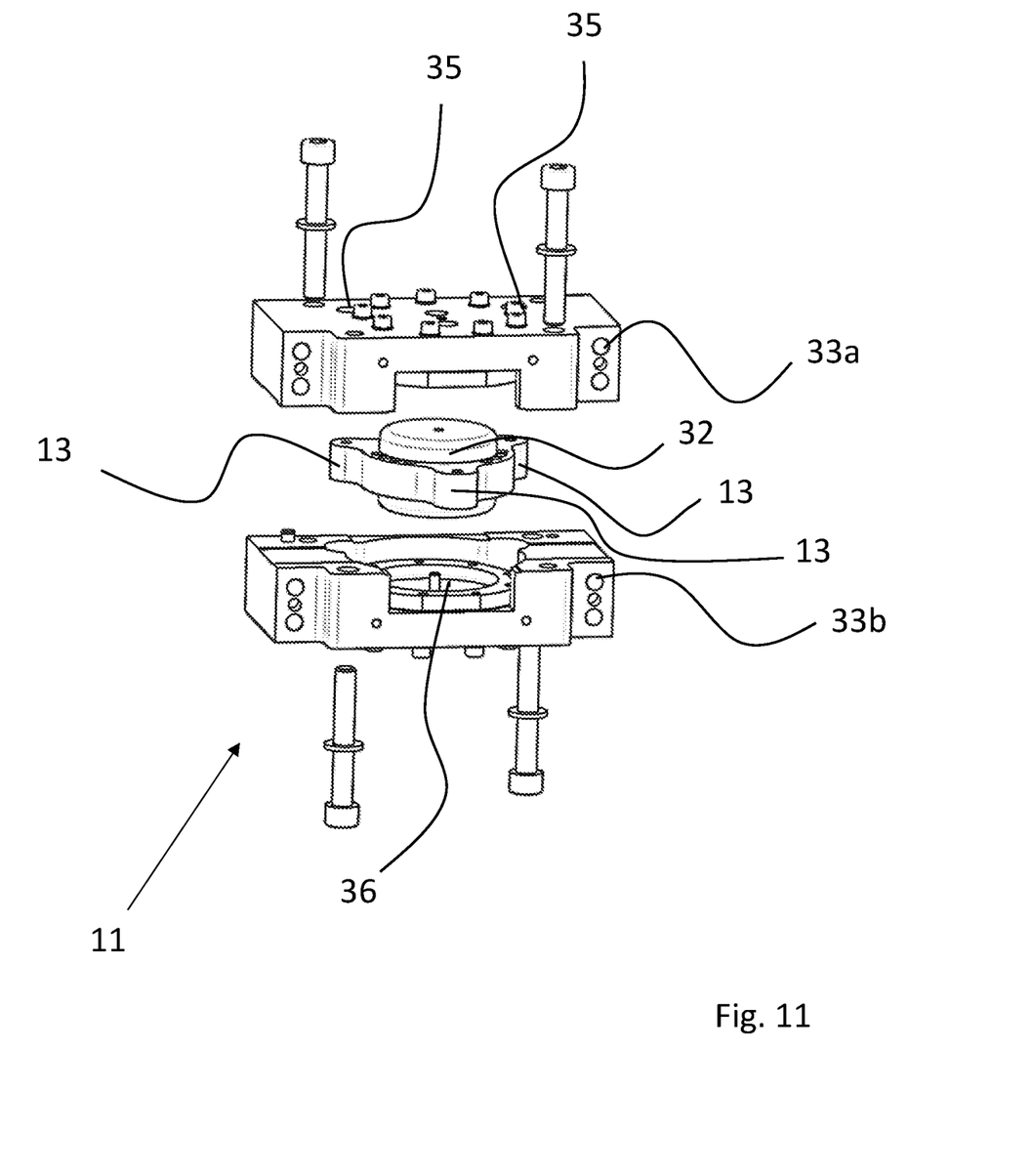
FIG. 11 is an exploded view of another actuator which is provided for generating compensation forces in horizontal direction.

FIG. 11 is an exploded view of the further pneumatic actuator 11 shown in FIG. 1, which serves to generate horizontal compensation forces.

It can be seen that the pneumatic actuator 11 comprises a housing with a housing upper part 33a and a housing lower part 33b, in which in the installed state the piston 32 is accommodated which divides the working space into two halves.

A membrane 36 can be seen here, which seals a pressure chamber and which is connected to the piston 32.

The housing upper part 33a is designed similarly and also comprises a pressure chamber sealed by a membrane, so that the actuator 11 is also effective in two opposite directions.

Furthermore, it can be seen that the piston 32 has three extensions 13 to which bending rods (12 in FIG. 2) can be mounted, which connect the pneumatic actuator 11 to the load to be isolated.

One of the extensions 13 protrudes out of the housing.

The bending rods to be mounted to the other two extensions 13 extend through the bores 35 in the housing in the installed state.

Figure 12:
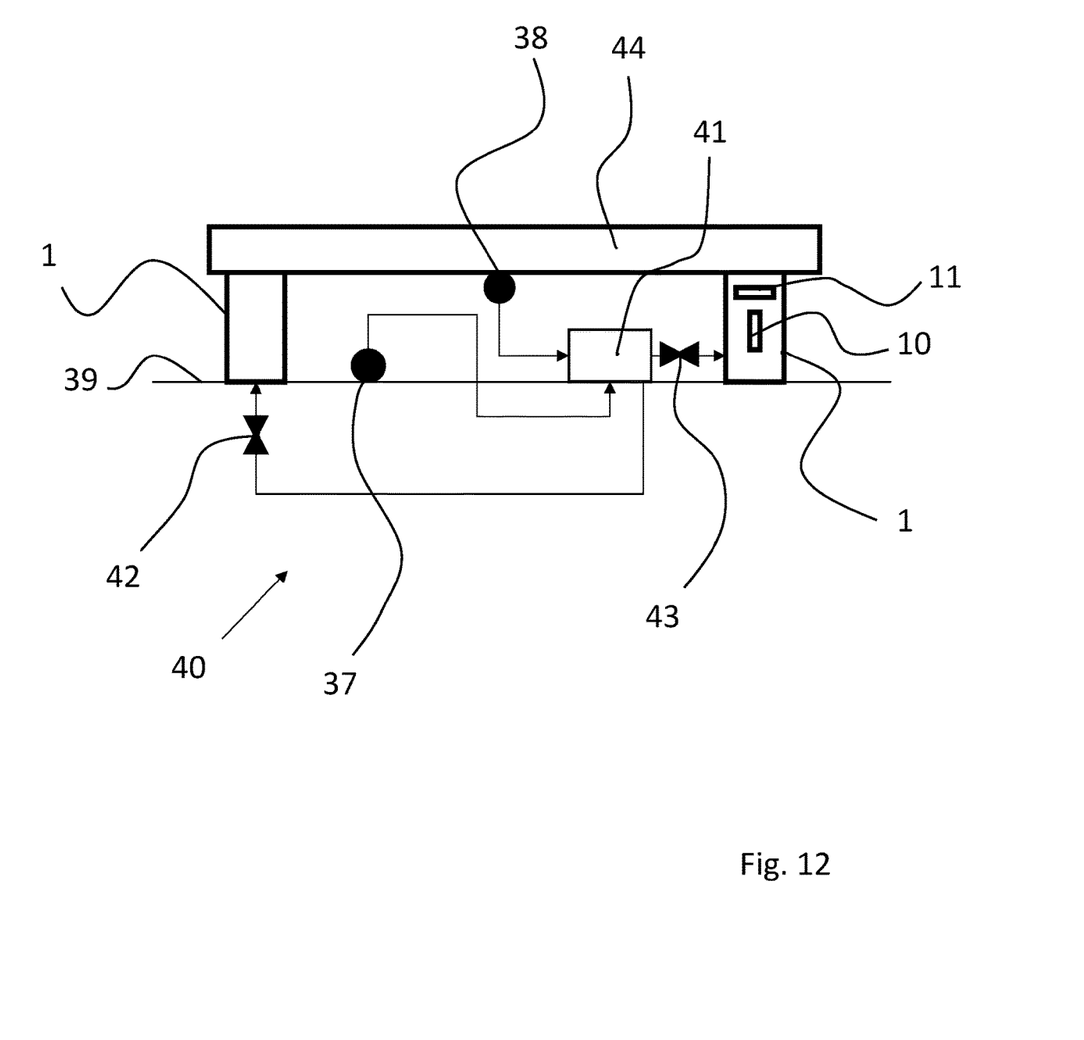
FIG. 12 is a schematic diagram of a vibration isolation system.

FIG. 12 is a schematic diagram of a vibration isolation system 40 in which the isolators 1 described above are installed.

Vibration isolation system 40 comprises a plate 44 which is mounted on the floor 39 supported by a plurality of isolators 1 for vibration isolation.

In this exemplary embodiment, a sensor 37 is provided which detects vibrations of the floor, and also a sensor 38 which detects vibrations of the load to be isolated.

Signals of these sensors are forwarded to control device 41 which in turn controls pneumatic valves 42, 43 for driving the pneumatic actuators 10, 11 incorporated in the isolators 1.

Based on the sensor signals, the pneumatic actuators 10, 11 generate compensation forces both in horizontal and vertical directions.

Only one respective control valve is illustrated here.

It will however be understood that for each pneumatic actuator 1 control valves have to be provided for both pressure chambers.

The invention permits to provide an isolator which is capable of generating high compensation forces in an active vibration isolation system with, at the same time, low heat dissipation.

LIST OF REFERENCE NUMERALS

1 Isolator
2 Piston
3 Working space
4 Bending pendulum
5 Upper part
6 Base
7 Recess
8 Leaf spring assembly
9 Leaf spring assembly
10 Actuator
11 Actuator
12 Bending rod
13 Extension
14 Bracket
15 Piston
16 Housing
16a Housing upper part
16b Housing middle part
16c Housing lower part
17 Piston middle part
18a, 18b Membrane
19a, 19b Clamping ring
20a, 20b Screws
21a, 21b Screws
22a, 22b Clamping ring
23a, 23b Screws
24 Threaded sleeves
25a, 25b Extension
26a, 26b Pressure chamber
27 Passage
28 Gap
29 Bore
30 Leaf spring
31 Leaf spring
32 Piston
33a Housing upper part
33b Housing lower part
35 Bore
36 Membrane
37 Sensor 38 Sensor
39 Floor
40 Vibration isolation system
41 Control device
42 Valve
43 Valve
44 Plate
45 Membrane
46 Housing

What is claimed is:

1. An isolator for a stationary vibration isolation system, the isolator comprising:
 a pneumatic spring providing vibration isolation at least in a vertical direction;
 a first pneumatic actuator for generating compensation forces in a horizontal direction; and
 a second pneumatic actuator for generating compensation forces in the vertical direction;
 wherein the second pneumatic actuator is arranged in a working space of the pneumatic spring; and
 wherein the second pneumatic actuator comprises:
  a housing;
  a piston is arranged in the housing, the piston movable in an axial direction, the piston is connected to at least two leaf springs that are spaced apart from each other.

2. The isolator as claimed in claim 1, further comprising another piston of the pneumatic spring that is guided axially by the at least two leaf springs that are spaced apart from each other.

3. An active vibration isolation system, comprising at least one isolator as claimed in claim 1.

4. An isolator for a stationary vibration isolation system providing vibration isolation in a horizontal direction and a vertical direction, the isolator comprising:
 a pneumatic spring having a piston; and
 at least one pneumatic actuator having an annular piston;
 wherein the annular piston extends annularly around the piston of the pneumatic spring; and
 wherein the pneumatic actuator has an annular configuration and is located within a working space of the pneumatic spring.

5. An isolator for a stationary vibration isolation system providing vibration isolation in a horizontal direction and a vertical direction, the isolator comprising:
 a pneumatic spring providing vibration isolation at least in the vertical direction, the pneumatic spring having a piston; and
 at least one pneumatic actuator having a piston;
 a base forming a bottom of the isolator; and
 leaf springs for axially guiding the piston of the pneumatic spring and the piston of the at least one pneumatic actuator, wherein the leaf springs are spaced apart from each other, and wherein the leaf springs couple each of the pistons to the base of the isolator in such a manner that the two pistons can only be displaced in an axial direction.

\* \* \* \* \*